United States Patent [19]
Miller

[11] Patent Number: 5,530,924
[45] Date of Patent: Jun. 25, 1996

[54] RADIO STATION MEMORY PRESETS WITH STORED AUDIO EFFECTS

[75] Inventor: Kenneth C. Miller, Canton, Mich.

[73] Assignee: Ford Motor Company, Dearborn, Mich.

[21] Appl. No.: 270,879

[22] Filed: Jul. 5, 1994

[51] Int. Cl.⁶ .................................................. H04B 1/16
[52] U.S. Cl. .................................. 455/186.1; 455/200.1; 455/267; 381/101
[58] Field of Search ........................ 455/185.1–186.2, 455/194.2, 200.1, 267; 381/98, 101–103, 107; 333/28 R, 28 T

[56] References Cited

U.S. PATENT DOCUMENTS 5,241,696  8/1993  Mori et al. ........................... 455/200.1

FOREIGN PATENT DOCUMENTS

0503154A2  9/1992  European Pat. Off. ............ 455/186.1
63-127613  5/1988  Japan ................................... 455/186.1

OTHER PUBLICATIONS

Car Stereo Review, Alpine Model 7513, Sep./Oct., p. 81.
Car Stereo Review, Eclipse EQS–2000, EQR–2140, & EQU–8040, DSP System, Nov./Dec. 1992, pp. 77–79.
Car Stereo Review, Panasonic CQ–DC1, DCC Tuner, Nov./Dec., 1993, p. 61.

*Primary Examiner*—Chi H. Pham
*Attorney, Agent, or Firm*—Mark Mollon; Roger L. May

[57] ABSTRACT

Selected broadcast stations are stored in a memory and accessed using preset memory buttons on a radio receiver. Audio effects such as tone settings and sound-field simulations are adjusted for a selected broadcast station in accordance with the tastes of an operator of the receiver. The audio effects are stored for recall whenever the selected broadcast station is accessed through the memory preset.

2 Claims, 2 Drawing Sheets

5,530,924

RADIO STATION MEMORY PRESETS WITH STORED AUDIO EFFECTS

BACKGROUND OF THE INVENTION

This application is related to copending application U.S. Ser. No. (93-0835) entitled "Control of Audio Effects in Radio Broadcast Receivers", which is incorporated herein by reference.

The present invention relates in general to radio receivers having stored radio station memory presets, and more specifically to storing audio treatments or audio effects in association with stored radio station presets.

Radio receivers, such as automotive audio systems, commonly use memory presets to facilitate tuning of frequently listened to broadcast stations. A typical receiver may have six memory buttons for storing six AM stations and 12 FM stations. Each memory button stores two FM stations by designating two FM banks, e.g. FM1 and FM2, which are accessed by pressing a control button for changing the receiving band.

To store a station, the desired station is tuned-in using manual or seek tuning. A selected memory button is pressed for a certain length of time, such as about two seconds. While the memory button is pressed, the audio sound output is muted and then returns once the broadcast station has been stored into the receiver memory corresponding to the selected memory button. Once a station is stored, pressing the selected memory button for less than two seconds will cause the radio to tune to the stored station.

Another feature of radio receivers is the ability to adjust a variety of treatments or audio effects for the received audio signal. Tonal qualities can be adjusted to the listeners preference, including treble level control and bass level control. Equalizers are employed to adjust the levels of more finely divided audio frequency ranges.

The sound image can also be adjusted using left-right balance and front-rear fade controls.

With the introduction of digital signal processing (DSP), additional treatments of the received audio signal are becoming available. For example, sound field simulation (also called concert hall emulation) adds selected reverberation to the reproduced audio to simulate various listening environments such as a concert hall, jazz club, or a stadium.

These various audio effects allow individual listeners to optimize an audio system to their individual preferences depending on the type of broadcast programming being received. For example, when listening to a "talk" radio station, it may be desirable to cut low frequencies to reduce "boominess" and to cut high frequencies to reduce noise, thereby improving speech intelligibility. Some operators/listeners may prefer to enhance bass levels when listening to rock, while some may prefer to enhance treble level when listening to classical or jazz music. Sound field simulation will also be selected according to the type of programming being received. For example, a jazz hall emulation may be desirable when listening to a jazz broadcast station.

When an operator retunes a receiver in order to listen to a different broadcast station, the audio effects can be readjusted to suit the programming of the new station. However, accessing these unique audio effects each time a radio station is retuned can become inconvenient.

SUMMARY OF THE INVENTION

The present invention provides improved convenience of use over prior radio receivers by providing memory storage of a desired audio effect corresponding to each broadcast channel corresponding to a memory preset.

Thus, a user may set tonal qualities and/or sound field simulations as appropriate for a particular broadcast channel which will automatically be recalled when accessing that broadcast channel via a memory preset. Since each broadcast station provides programming primarily according to a particular format, the audio effects saved with a memory preset will restore the user's preferences for that format.

More specifically, the invention is an audio system comprising a radio tuner selectably tunable to a plurality of broadcast channels. Audio system operator inputs include a plurality of memory presets for selecting a selected broadcast channel and at least one treatment selector for selecting a desired audio effect. An audio processor coupled to the radio tuner and the treatment selector treats an audio signal derived from the broadcast channel with the desired audio effect. A memory stores broadcast channels corresponding to each of the memory presets, respectively, and stores a desired audio effect corresponding to each of the memory presets, respectively. A control is responsive to an activation of a respective memory preset to send a tuning command to the radio tuner corresponding to a stored broadcast channel associated with the respective memory preset. The control sends a treatment command to the audio processor corresponding to a stored audio effect associated with the respective memory preset. The stored audio effect may be transferred into memory either manually when the broadcast channel is stored or automatically during adjustment of the audio effect whenever the tuned-in broadcast channel was accessed via a memory preset button.

DETAILED DESCRIPTION OF THE PREFERRED EMBODIMENTS

Figure 1:
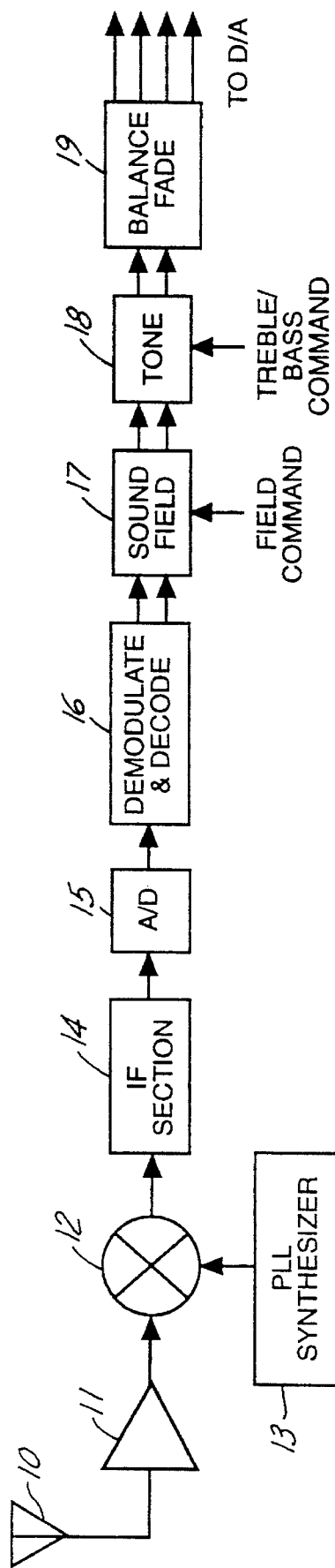
FIG. 1 is a block diagram showing a portion of a radio receiver according to the present invention.

FIG. 1 shows an audio signal path within a typical radio receiver. An antenna 10 receives radio frequency broadcast signals from a plurality of broadcast stations, such as AM or FM stations. The broadcast signals picked up by antenna 10 are amplified by an RF amplifier 11 that provides amplified RF signals to one input of a mixer 12. A phase-locked loop (PLL) synthesizer 13 provides a mixing signal to a second input of mixer 12. In response to a tuning command, PLL synthesizer 13 generates a mixing signal having the appropriate frequency for superheterodyning a selected broadcast signal to the intermediate frequency used in the receiver. The resulting IF signal is provided to an IF section 14 for amplifying and filtering the IF signal.

An analog-to-digital (A/D) converter 15 digitizes the IF signal and provides it to a demodulate and decode block 16. The original audio broadcast is demodulated to recover the transmitted audio and is decoded to recover stereo left and right channels which are provided to a sound field generator 17. A field command determines a particular sound field simulation including particular reverberation characteristics as generated by sound field generator 17. The sound field command may, for example, emulate sound fields of a concert hall, stadium, jazz club, or may introduce no sound field modification at all. A tone generator 18 receives a stereo signal from sound field generator 17 and modifies the signal gain for respective audio frequency ranges, such as treble level and bass level, according to commands from the user, such as a treble command and bass command. The tonally adjusted stereo signals are provided to a balance/fade network 19 for providing front and rear stereo signals for reproduction. The signals are provided to a digital-to-analog (D/A) converter and then to an analog amplifier and speakers.

Blocks 16–19 in FIG. 1 are preferably implemented using DSP circuits and programs. However, the invention equally pertains to use of analog circuits to accomplish these functions.

Figure 2:
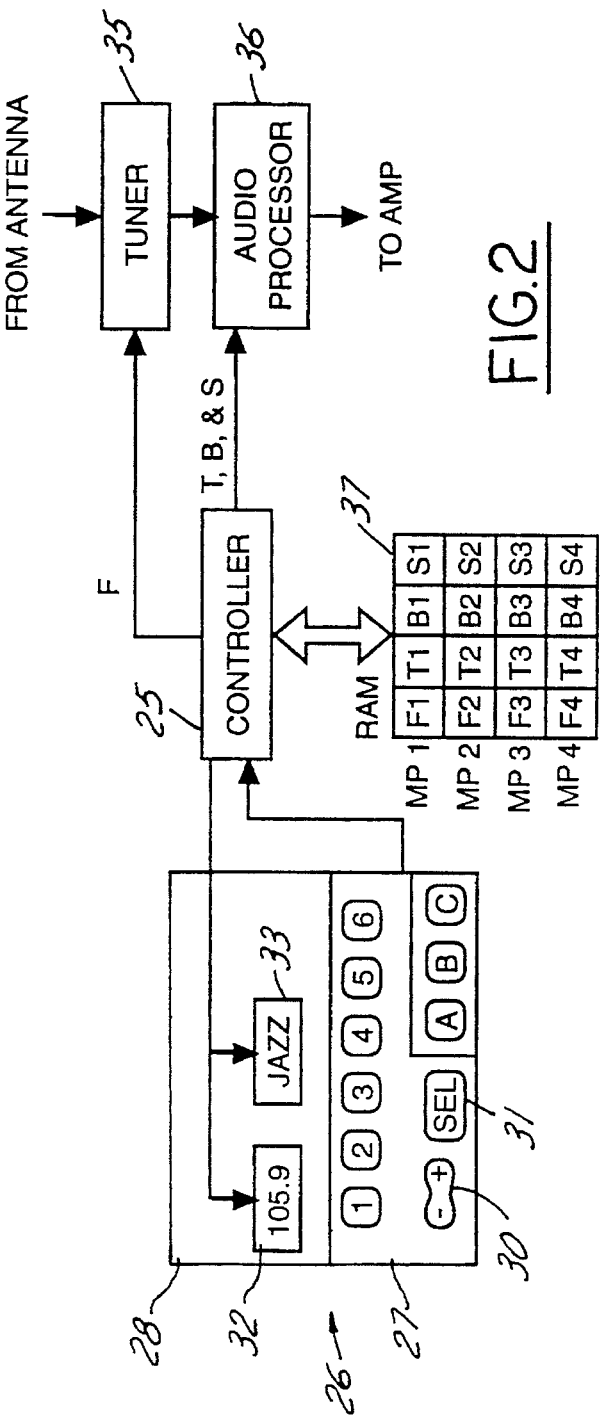
FIG. 2 is a block diagram showing memory access according to the present invention.

Further elements of a radio receiver for implementing the present invention are shown in FIG. 2. A main controller 25, preferably including a programmed microprocessor, is connected to a radio bezel 26 including operator inputs 27 and an informational display 28. Operator inputs 27 include memory presets designated 1 through 6 and sound field selector buttons designated A, B, and C. An adjustment rocker 30 and a selection button 31 are used to adjust various receiver parameters such as volume, tuning frequency, treble level, bass level, balance and fade as is known in the art. Display 28 includes a display segment 32 for showing the tuned-in frequency and other receiver parameters during their respective adjustment. A display segment 33 shows the sound field simulation being invoked. Controller 25 receives signals from the operator inputs for selecting a broadcast station and the desired audio effects.

In response to the operator inputs, controller 25 provides a frequency tuning command F to tuner 35. Likewise, a treble command T, a bass command B, and a sound field command S are provided from controller 25 to an audio processor 36 based on the operator inputs. Audio processor 36 corresponds to blocks 16–19 in FIG. 1.

Controller 25 is connected to a random access memory (RAM) 37 which stores memory preset information. For illustration purposes, RAM 37 is shown as including a series of rows corresponding to each memory preset and each having a starting address designated MP1, MP2, MP3, and MP4. Memory row MP1 has designated RAM locations for storing a tuning frequency F1, a treble level T1, a bass level B1, and a sound field S1 that correspond to memory preset button #1. Memory preset button #2 is associated with row MP2 in RAM 37, which includes a frequency value F2, treble level T2, bass level B2, and sound field S2 and so forth for each other row. For the example where there are 18 total presets (6 AM and 12 FM), RAM locations up to MP18 would be utilized.

Figure 3:
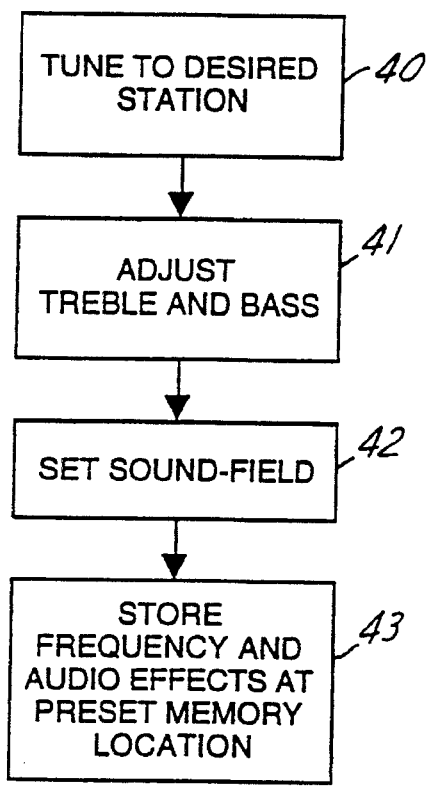
FIG. 3 is a flow-chart showing a first embodiment for storing a frequency and audio effects at a preset memory location.
Figure 4:
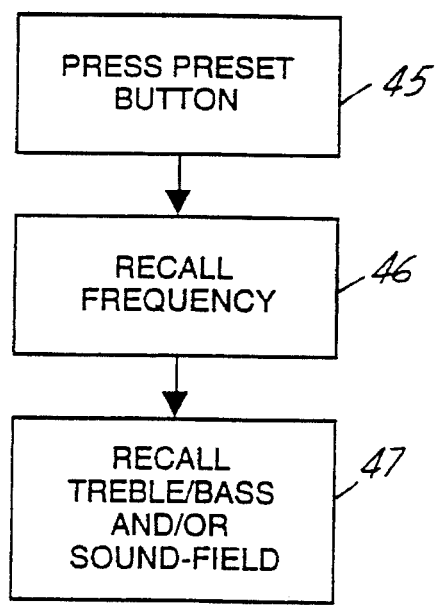
FIG. 4 is a flow-chart showing recall from a preset memory location.

Operation of a preferred embodiment of the invention will best be understood with reference to FIGS. 3 and 4. Initially, an operator tunes to a desired broadcast station in step 40 (e.g. using adjustment rocker 30 and function selection button 31 in FIG. 2). Depending upon the format of the desired broadcast station, the operator adjusts treble and bass levels to suit their taste in step 41 (using the same rocker and selection switches). If available and if desired, the operator may set a sound field simulation in step 42. In step 43, the operator depresses the memory preset button for a certain length of time in order to store the frequency of the selected broadcast station and the selected audio effects at the preset memory location.

Subsequent operation of the radio receiver is shown in FIG. 4. When a preset button is pressed in step 45, any frequency stored in association with that preset button is recalled in step 46. The treble and bass levels and/or any sound field associated with the preset button are recalled in step 47. The recalled values are used by the receiver main controller to control operation of the receiver. Other audio effects can also be stored and recalled such as balance and fade.

Figure 5:
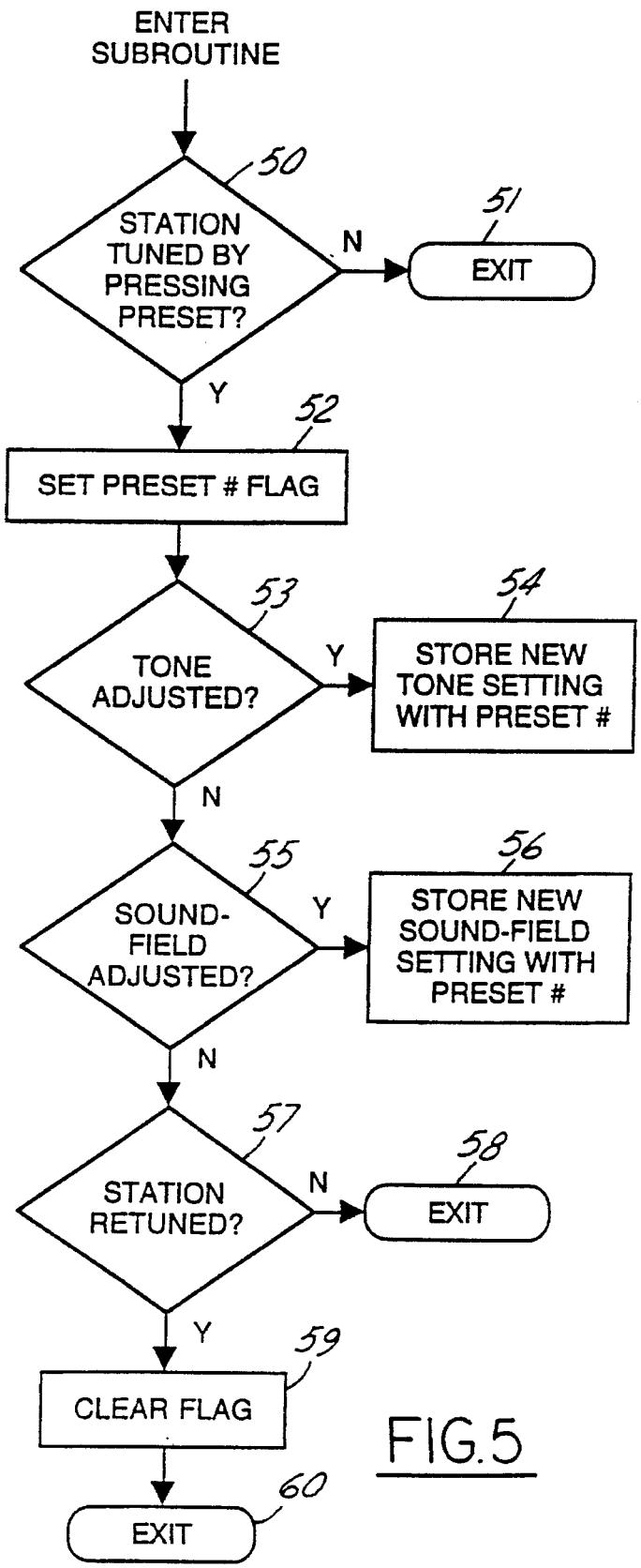
FIG. 5 is a flow-chart showing an alternative embodiment for storing audio effects associated with a memory preset.

In the method shown in FIG. 3, audio effects are stored in association with a desired station whenever the operator manually stores the desired station for a memory preset. FIG. 5 shows an alternative method wherein audio effects are dynamically stored whenever they are adjusted while listening to a broadcast station which was accessed via the memory preset. Thus, the main controller performs a subroutine which determines whether the tuned-in station was tuned to by pressing a preset button in step 50. If not, then the subroutine is exited in step 51. Otherwise, a flag is set to identify the preset number which was invoked in step 52. The occurrence of a tone adjustment is monitored in step 53. If the tone was adjusted then a new tone setting is stored with the preset number in step 54 and the subroutine is exited. Likewise, a change in the sound field is monitored in step 55. If the sound field is adjusted, then the new sound field setting is stored with the preset number in step 56 and the subroutine is exited.

A determination is made in step 57 whether the broadcast station has been retuned. If not then the subroutine is exited in step 58. If the station has been retuned, then the preset flag is cleared in step 59 and the subroutine is exited in step 60.

What is claimed is:

1. An audio system comprising:

a radio tuner selectably tunable to a plurality of broadcast stations;

audio system operator inputs including a plurality of memory presets for selecting a selected broadcast station and at least one treatment selector for selecting a desired audio effect;

an audio processor coupled to said radio tuner and said treatment selector, said audio processor treating an audio signal derived from said broadcast station with said desired audio effect;

a memory storing broadcast stations corresponding to each of said memory presets, respectively, and storing a desired audio effect corresponding to each of said memory presets, respectively; and a control responsive to an activation of a respective memory preset to send a tuning command to said radio tuner corresponding to a stored broadcast station associated with said respective memory preset and to send a treatment command to said audio processor corresponding to a stored audio effect associated with said respective memory preset, wherein said control updates a respective stored audio effect in response to an activation of said treatment selector when a currently tuned-in broadcast station was accessed by activation of one of said memory presets.

2. A method of operating an audio system including a broadcast radio receiver having a plurality of memory presets, comprising the steps of:

tuning said receiver to a desired broadcast station;

storing an identification of said desired broadcast station in a memory at a first memory location associated with a selected one of said memory presets;

recalling said identification of said desired broadcast station from said first memory location and tuning said receiver to said desired broadcast station in response to activation of said selected one of said memory presets;

storing an indication that the currently tuned broadcast station was accessed by activation of said selected one of said memory presets;

adjusting an audio effect selected from the group comprising treble level, bass level, and sound field simulation according to a desired reproduction character of said desired broadcast station and concurrently storing an identification of said audio effect in said memory at a second memory location associated with said selected one of said memory presets;

recalling said identification of said desired broadcast station from said first memory location and said identification of said audio effect from said second memory location in response to an activation of said selected one of said memory presets; and tuning said receiver and adjusting said audio effect based on said recalled identifications, respectively.

* * * * *